(12) United States Patent
Nilsson

(10) Patent No.: US 7,489,197 B2
(45) Date of Patent: Feb. 10, 2009

(54) COUPLING NET AND MMIC AMPLIFIER

(75) Inventor: Joakim Nilsson, Mölndal (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 70 days.

(21) Appl. No.: 11/720,497

(22) PCT Filed: Dec. 3, 2004

(86) PCT No.: PCT/SE2004/001785

§ 371 (c)(1),
(2), (4) Date: May 30, 2007

(87) PCT Pub. No.: WO2006/059930

PCT Pub. Date: Jun. 8, 2006

(65) Prior Publication Data

US 2008/0164946 A1   Jul. 10, 2008

(51) Int. Cl.
*H03F 3/68* (2006.01)
(52) U.S. Cl. .................. 330/295; 330/124 R; 330/53
(58) Field of Classification Search ............... 330/295, 330/124 R, 53
See application file for complete search history.

(56) References Cited

U.S. PATENT DOCUMENTS

| 4,348,643 | A | * | 9/1982 | Tennyson | 330/294 |
| 4,540,950 | A | * | 9/1985 | Ross | 330/267 |
| 5,111,157 | A | * | 5/1992 | Komiak | 330/286 |
| 5,703,530 | A | * | 12/1997 | Sato et al. | 330/149 |
| 6,768,381 | B2 | * | 7/2004 | Kuriyama | 330/295 |
| 6,816,012 | B2 | * | 11/2004 | Aoki et al. | 330/276 |
| 2002/0036541 | A1 | | 3/2002 | Buer | |

OTHER PUBLICATIONS

"1 Watt 17.7GHz-32 GHz Linear Power Amplifier, application note #52-Rev. A. Jul. 1, 1998" Agilent Technologies.

\* cited by examiner

*Primary Examiner*—Patricia Nguyen

(57) ABSTRACT

Microwave coupling network comprising a passive resistive pi net and a coupling capacitor is coupled to a branching point. The branching point is coupling to respectively a plurality of common drain FET amplifier stages or respectively to common collector BJT amplifier stages, wherein respectively the source, or respectively the emitter, is coupled to at least one output port.

5 Claims, 6 Drawing Sheets

COUPLING NET AND MMIC AMPLIFIER

FIELD OF THE INVENTION

The present invention relates to microwave coupling network, in particular for use with MMIC amplifiers and an MMIC amplifier.

BACKGROUND OF THE INVENTION

Standard package CMOS based MMIC (Microwave Monolithic integrated Circuits) devices are for cost reasons widely used in microwave frequency applications. MMIC amplifiers typically consist of arrays of transistors coupled in parallel.

Since MMIC amplifiers typically have a fixed upper power limit, a distribution net or coupling network is needed in applications where the power output exceeds the output power of available individual MMICs.

Distributing networks are widely used in antenna array designs. One such example is given in prior art document US2001/0054983 (FIG. 1) showing an amplifier/antenna device comprising three stages of parallel-coupled MMIC CMOS FET amplifier elements, for distributing power across multiple antenna elements of an antenna array.

In antenna/amplifiers devices of the above kind it is possible to distribute a signal on the input terminal to the various output terminals with the same phase delay. One drawback of the above arrangement is that the circuit is sensitive for manufacturing tolerances, with breaches leading to signal reflections and power losses. From a practical perspective, it would therefore be necessary to provide a plurality of tuning elements to accomplish stable performance over a wide frequency bandwidth.

For similar circuits as shown above, the branching network coupled to MMIC amplifiers may be designed so that the output impedance of the branching network corresponds to the input impedance of the MMIC amplifier. Moreover, typically the input impedance at the input terminal is typically rendered close to the commonly chosen system input impedance value of 50Ω in order to provide connectivity with other equipment for avoiding reflections.

US2002/0036541 shows a MMIC power amplifier comprising a 2-4-8-topology power splitter network and combining network for evenly splitting the power to the MMIC's and for combing the output power. The drain of a preceding stage is coupled to the gates of a proceeding stage via a matching and splitting network. The amplifier seems to constitute a narrow bandwidth solution.

The article "1 Watt 17.7 GHz-32 GHz Linear Power Amplifier, application note #52—Rev. A. 1, July 1998", Agilent Technologies, shows a thin film microcircuit network based on a variation of a Wilkinson divider, which divides the power to a plurality of MMIC amplifier devices and combines the respective outputs. The network maintains a 50 Ohm impedance at the input and output terminals.

OTHER KNOWN PRIOR ART

A known common drain field effect transistor FET amplifier stage has been shown in FIG. 1. It is known that this stage provides high input impedance and low output impedance while disclosing a gain close to 1. In the common drain coupling, the phase-shift of the signal from input to output is small.

SUMMARY OF THE INVENTION

It is a first object of the invention to accomplish a coupling network for microwave range signals having robust properties with regard to circuit layout, temperature and component tolerances.

A microwave coupling network comprises a passive resistive pi net and a coupling capacitor is coupled to a branching point. The branching point is coupled to a plurality of common drain FET amplifier stages, or common collector BJT amplifier stages, respectively, wherein the source or the emitter provides at least one output port.

It is a further object to set forth an amplifier, having low losses and high gain.

Further advantages will appear from the following detailed description of the invention.

DETAILED DESCRIPTION OF PREFERRED EMBODIMENTS OF THE INVENTION

Figure 1:
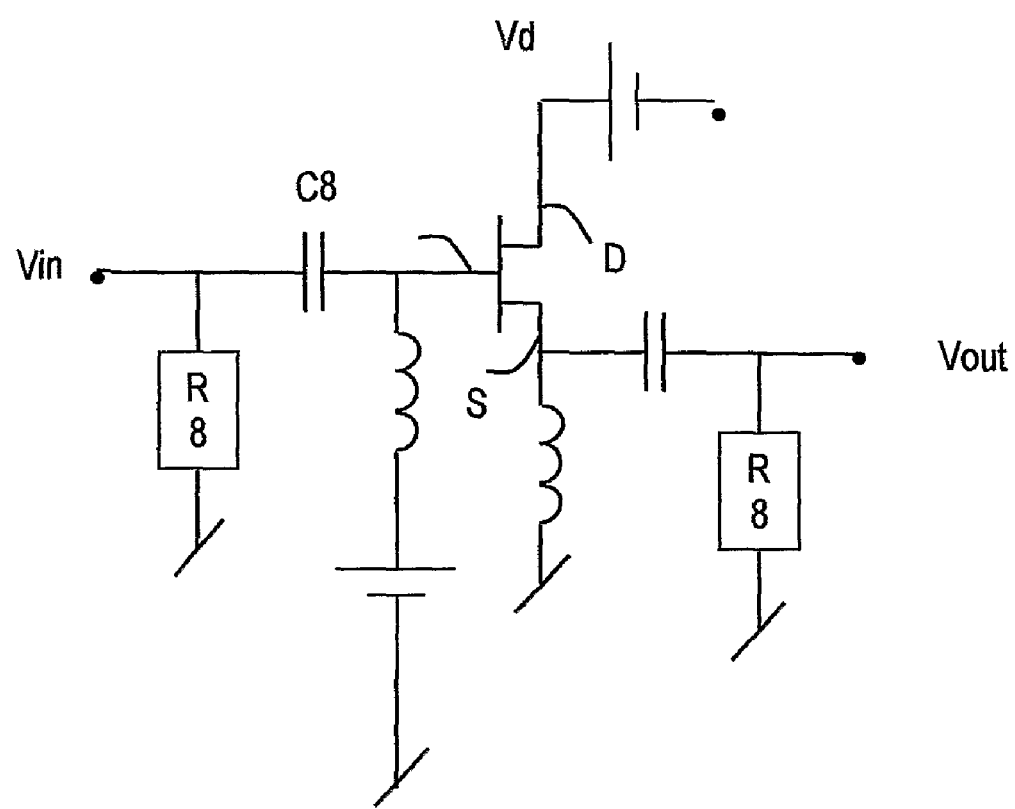
FIG. 1 shows a known common drain amplification stage.
Figure 2:
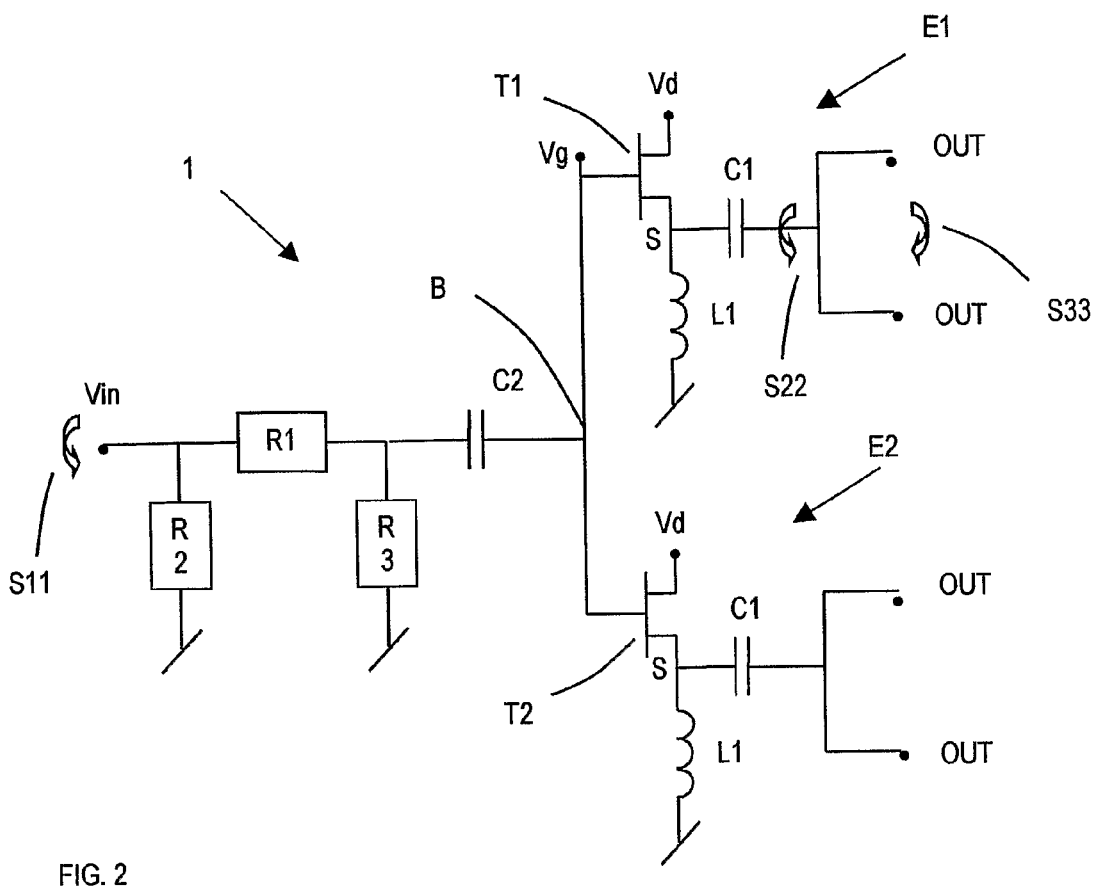
FIG. 2 shows a coupling network according to the first preferred embodiment of the invention.

In FIG. 2, a preferred embodiment of a microwave coupling network 1 according to the invention has been shown.

The microwave coupling network comprises an input terminal IN, a passive input stage comprising resistors R1, R2 and R3, forming a resistive pi net, a capacitor C2, (DC-blocking—no signal blocking), leading to the gates of a plurality of identical transistor stages, E1, E2 via branching point B.

The coupling network transistor stages, E1 and E2, are common drain transistor stages. Although only two stages are shown, use of several transistor stages are envisaged, the upper limit being practically restricted by the available space on the substrate or circuit board carrying the components in the actual implementation. The transistors used may be depletion mode FETs, enhancement mode FETs or bipolar transistor types. In the following, reference will be made to an embodiment in which FET's are used.

Each transistor stage, E1 and E2, is being provided with an output capacitor C1, for DC-blocking, being connected to two output ports, OUT, and an inductor L1 coupling to source of the FET and ground. DC-supply voltages Vd are providing power to the drains of the FET's and a bias voltage Vg for turning on the FETs.

An alternative embodiment is envisaged (not shown) wherein the FET transistor stage is replaced by a BJT (Bipolar junction transistor) stage such that the emitter of the BJT is connected to the at least one output port (OUT).

The output impedance of each transistor stage may be regulated, by choosing appropriate values of Vd and L1 and transistor type FET's including model specific parasitic capacitances.

The common drain transistor stage has the property of a voltage gain typically under 1, while the power gain, corresponding to the current delivering ability, is relatively high. Exemplary values correspond to typically 10 dB.

As mentioned above, the input impedance of the transistor stage is very high and the output impedance is low.

The resistive pi-network, R1-R3, provides stable broadband input compliancy and the common drain stages provide good matching to the inputs of the following transistor stages.

The coupling as a whole provides robust impedance matching properties and well defined impedance characteristics at lower frequencies.

Figure 3:
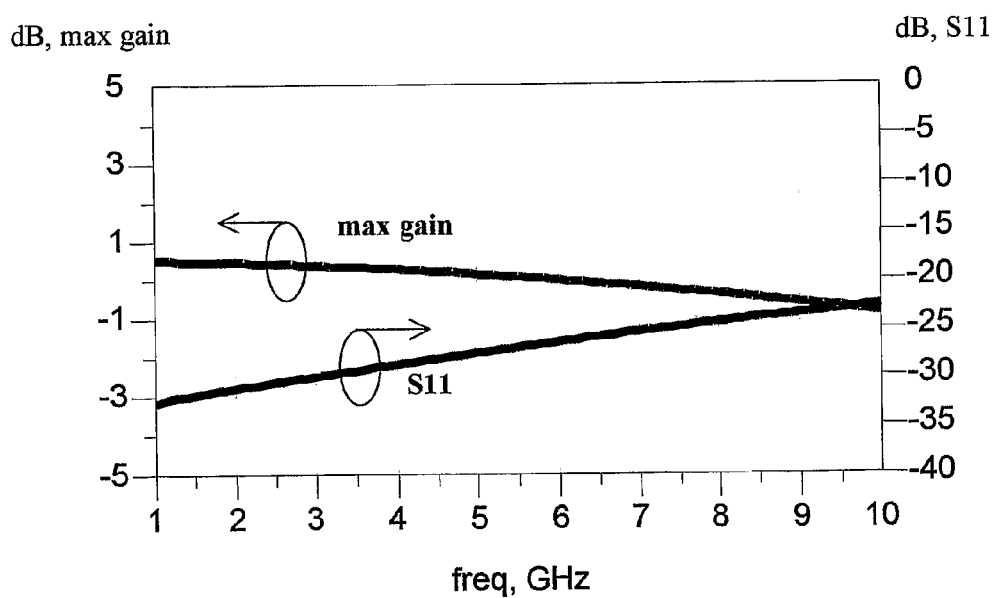
FIG. 3 shows simulated values of the properties of the microwave coupling network of FIG. 2 with regard to gain and input impedance.

In FIG. 3, the max gain for the coupling network has been examined by simulation showing a very linear shape from about 0.5 dB at 1 GHz to −1 dB at 10 Ghz. In the same interval, the input impedance S11 shows a very linear shape having values from −30 dB at 1 GHz to −20 dB at 10 GHz.

The simulation is based on the following values: R1=60 Ohm, R2=R3=110 Ohm, L1=0.8 nH.

The output impedances S22 and S33 as simulated for the above network form conjugate values such that S22*≈S33.

Figure 4:
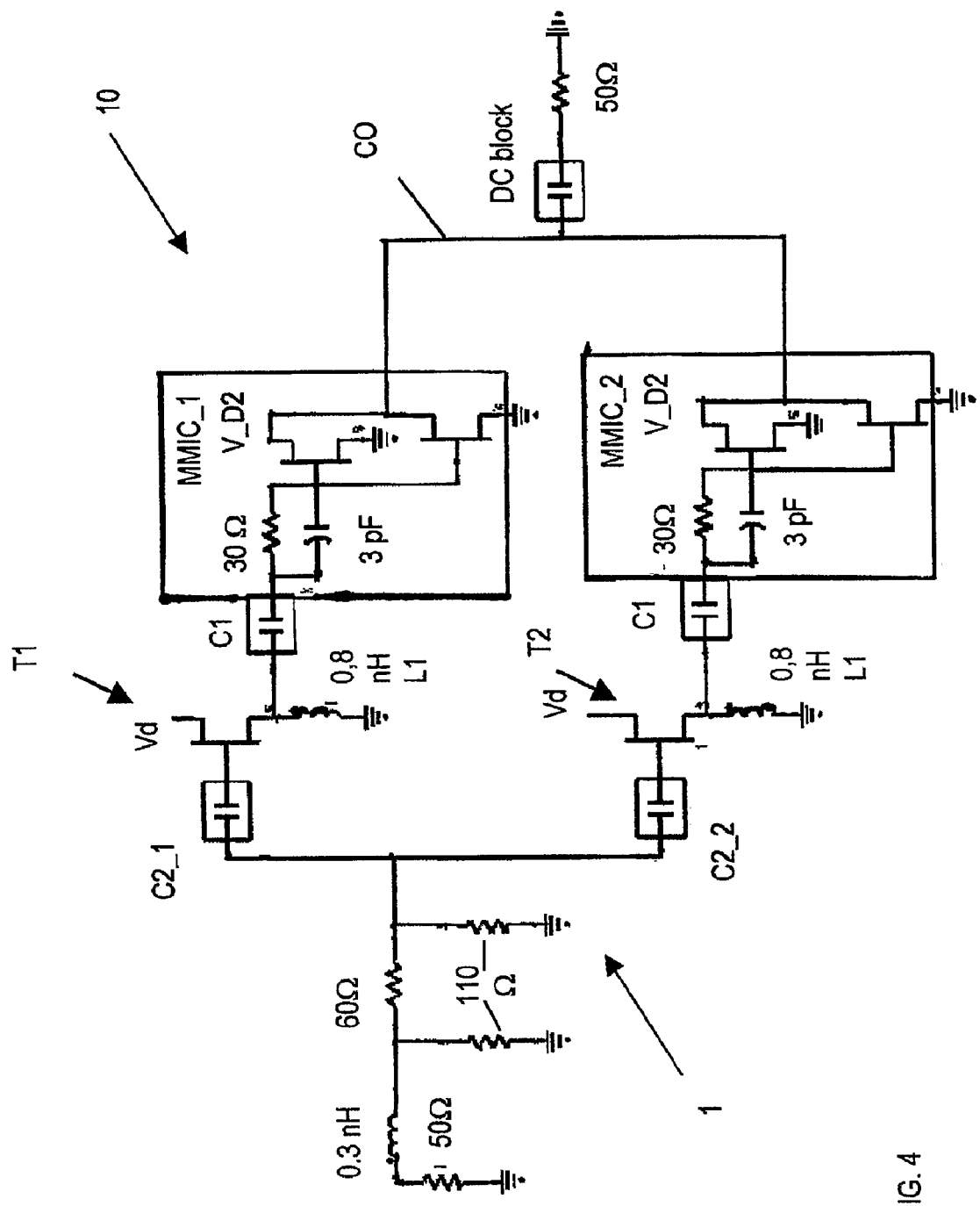
FIG. 4 shows an MMIC amplifier according to the invention.

In FIG. 4, the coupling network 1 has been shown for a microwave amplifier (10) comprising a coupling network (1), comprising a plurality of MMIC amplifiers, wherein each output terminal (OUT) of the coupling network is connected to at least one MMIC amplifier (MMIC1, MMIC2), each MMIC amplifier having its drain terminal connected to a common output terminal (CO).

The embodiment shown in FIG. 4 comprises two branches and MMIC amplifiers, MMIC1 and MMIC2, each comprising two parallel-coupled FETs having their source terminals connected to a common output terminal, the output terminals of the MMIC's moreover being connected. The coupling network is slightly modified over the FIG. 2 embodiment in that blocking capacitor C2 is replaced by C2_1 and C2_2. For simulating purposes the input terminal is terminated in a 0.3 nH/50 Ohm load and the output terminal is dissipating energy into a 50 Ohm load.

Figure 5:
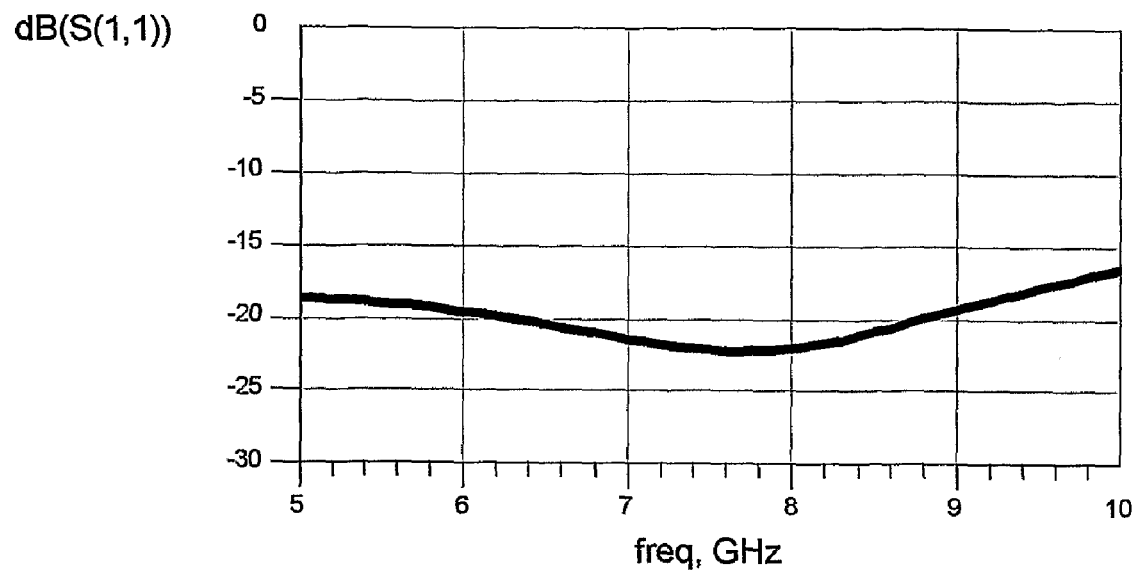
FIG. 5 shows an amplifier according to the invention incorporating the coupling network of FIG. 2.
Figure 6:
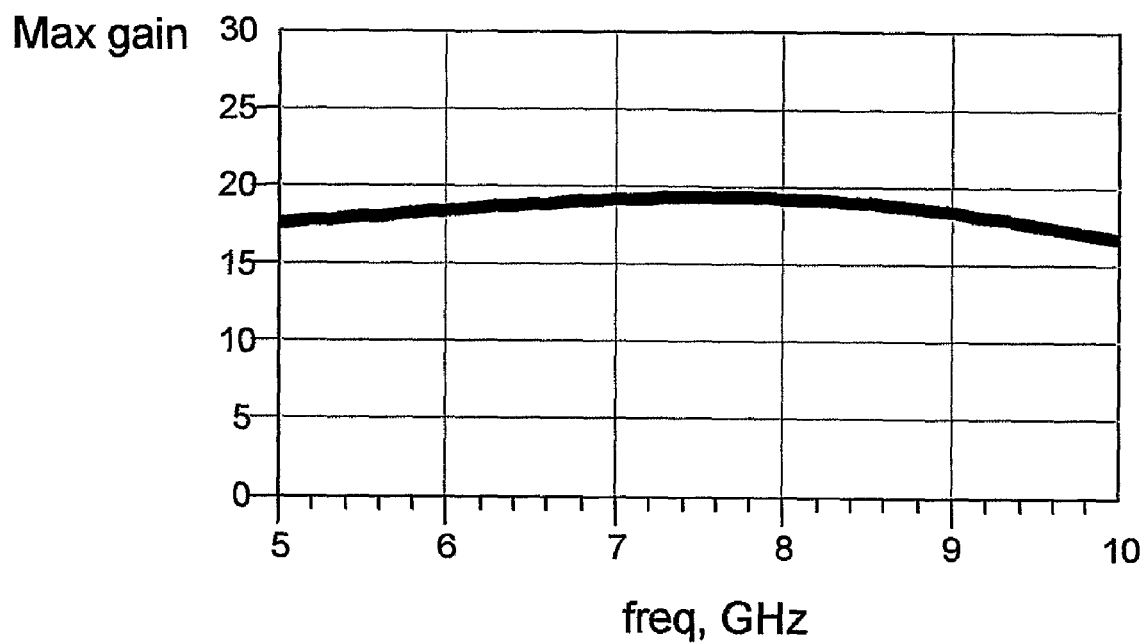
FIG. 6 shows the performance of the amplifier shown in FIG. 5.

The corresponding input impedance S11 and max gain for the amplifier 10 has been shown in FIGS. 5 and 6.

As mentioned above it should be noted that there would not appear to be any upper limits as to how many branches and corresponding number MMIC amplifiers could be provided for each branching point. Hence, a 1-n topology amplifier is set forth, wherein the number n, corresponding to the number of transistor stages E1, E2 . . . En, would depend on the physical space available on the substrate carrying the coupling network. As stated above, practical upper limits could amount to n~10.

Figure 7:
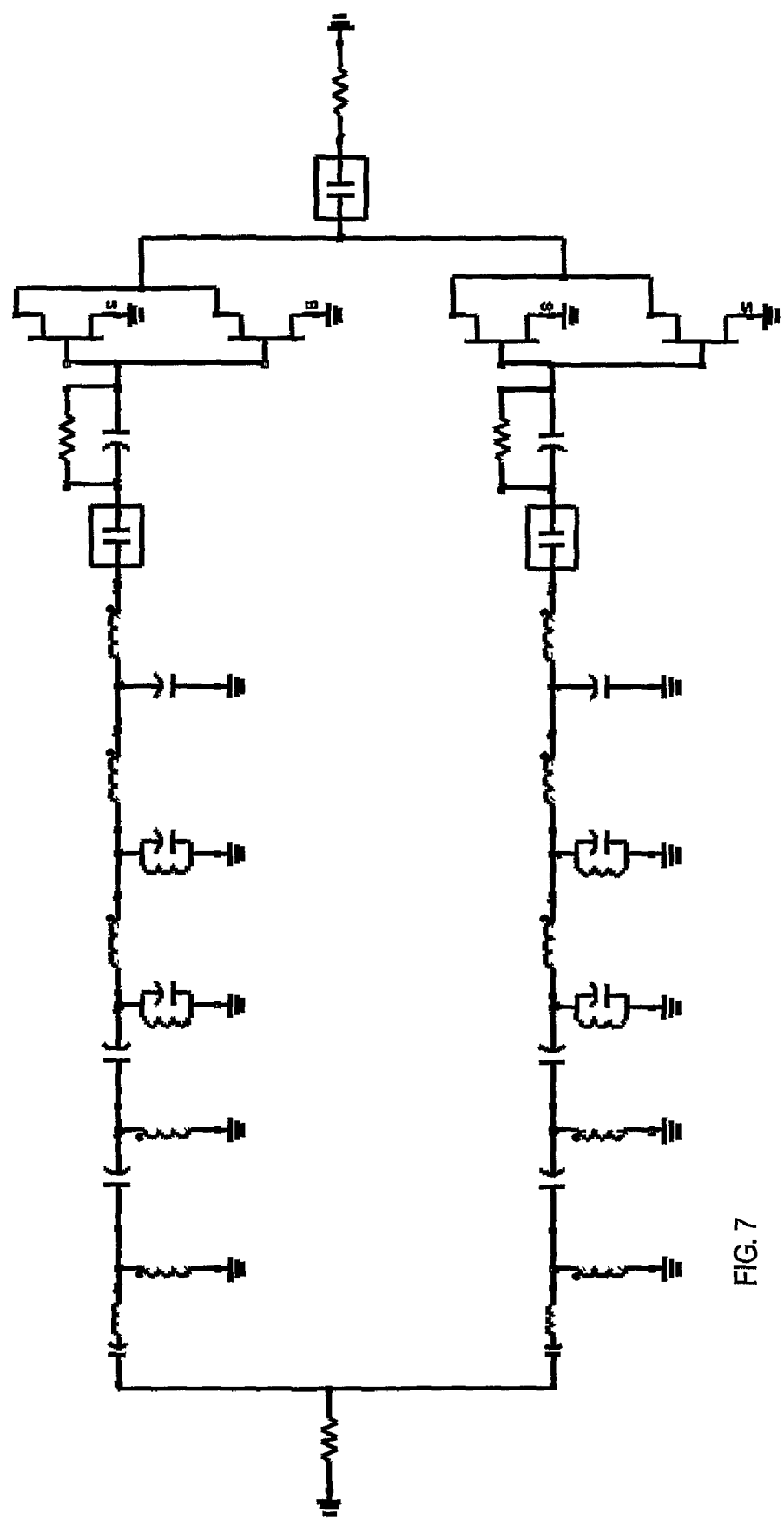
FIG. 7 shows an exemplary reference amplifier comprising a passive 5-pole coupling network.
Figure 9:
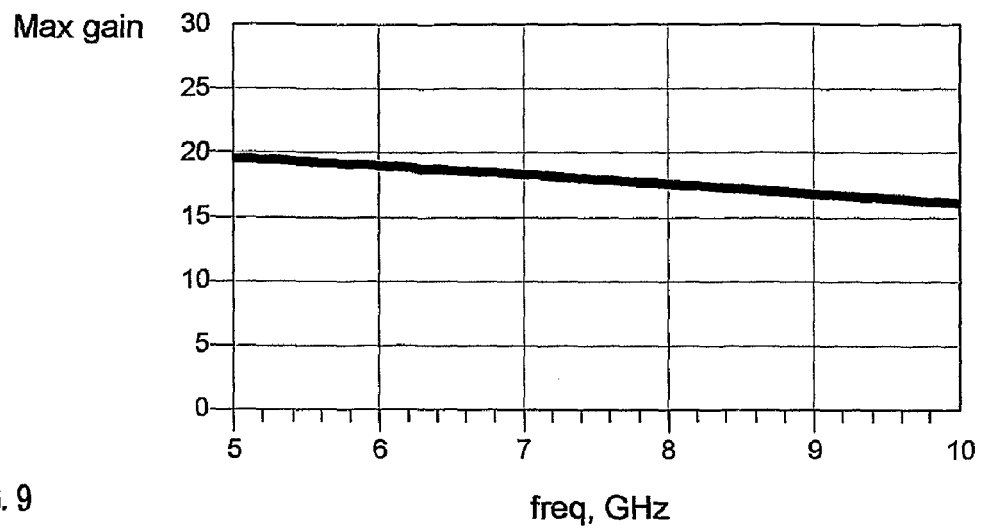
FIGS. 8 and 9 shows the performance of the amplifier shown in FIG. 7.
Figure 8:
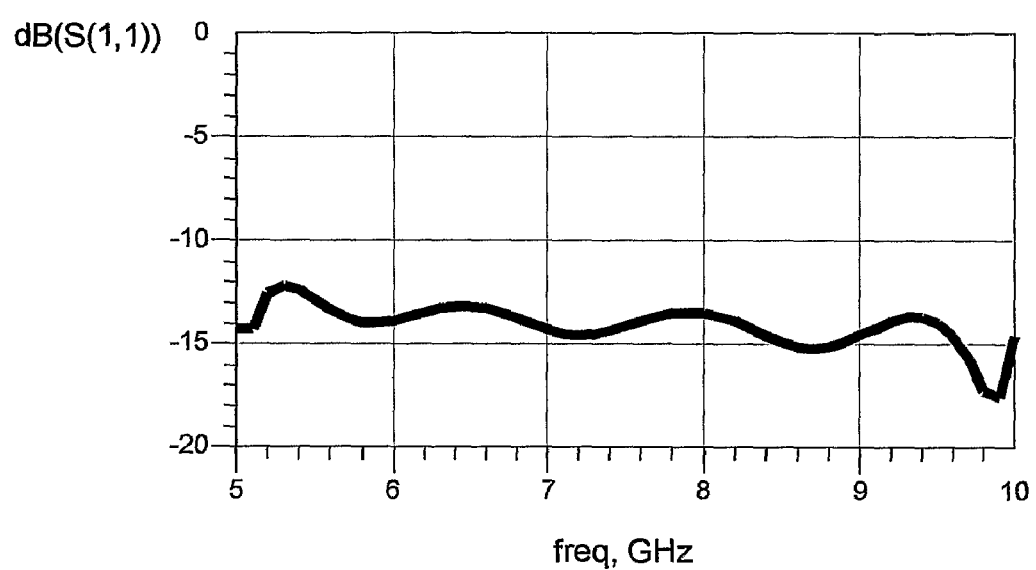

In FIG. 7 a reference resistive coupling network has been shown designed with passive components so as to form an amplifier using the same MMIC amplifiers as shown in the FIG. 4 embodiment according to the invention. It appears that the passive R, L, C coupling network at least comprises 5 poles to match the performance of the active coupling network, and thus appears not feasible taking typical component and manufacturing tolerances into account.

In contrast, the coupling network and the amplifier according to the present invention appears robust and viable for production in large numbers at a reasonable cost. The bandwidth of the passive coupling is moreover deemed to exceed the bandwidth obtainable with a passive coupling network.

The invention claimed is:

1. A microwave coupling network comprising:
   a passive resistive pi net and
   a coupling capacitor coupling to a branching point, the branching point coupling to a plurality of common drain FET amplifier stages, or common collector BJT amplifier stages, respectively, wherein the source, or the emitter, is providing at least one output port.

2. The microwave coupling network according to claim 1, wherein the source is connected to ground via an inductor and wherein the source is coupled to the at least one output port through a DC blocking output capacitor.

3. The microwave coupling network according to claim 1, wherein two outputs are provided at the source/emitter.

4. A microwave amplifier comprising:
   a coupling network comprising
      a passive resistive pi net and
      a coupling capacitor coupling to a branching point, the branching point coupling to a plurality of common drain FET amplifier stages, or common collector BJT amplifier stages respectively, wherein the source or the emitter is providing at least one output port, and
   a plurality of MMIC amplifiers, wherein each output terminal of the coupling network is connected to at least one MMIC amplifier, each MMIC amplifier having its drain terminal connected to a common output terminal.

5. The microwave amplifier according to claim 4, wherein the number of transistor stages is in the range of 2-10.

* * * * *